(12) United States Patent
Gibert et al.

(10) Patent No.: US 11,161,617 B2
(45) Date of Patent: Nov. 2, 2021

(54) METHOD OF FABRICATING ROTARY EQUIPMENT FOR A ROTARY WING, PROVIDED WITH A DEICER, SAID ROTARY EQUIPMENT, AND A DRONE PROVIDED WITH SAID ROTARY EQUIPMENT

(71) Applicant: AIRBUS HELICOPTERS, Marignane (FR)

(72) Inventors: Gauthier Gibert, La Fare les Oliviers (FR); Nicolas Imbert, Marseilles (FR)

(73) Assignee: AIRBUS HELICOPTERS, Marignane (FR)

( * ) Notice: Subject to any disclaimer, the term of this patent is extended or adjusted under 35 U.S.C. 154(b) by 672 days.

(21) Appl. No.: 16/018,380

(22) Filed: Jun. 26, 2018

(65) Prior Publication Data

US 2018/0370638 A1 Dec. 27, 2018

(30) Foreign Application Priority Data

Jun. 27, 2017 (FR) ...................................... 1770681

(51) Int. Cl.
*B64D 15/12* (2006.01)
*H05B 3/26* (2006.01)
(Continued)

(52) U.S. Cl.
CPC .............. *B64D 15/12* (2013.01); *B64C 27/32* (2013.01); *B64C 39/024* (2013.01); *H05B 3/26* (2013.01);
(Continued)

(58) Field of Classification Search
CPC ...... B64D 15/12; H05B 3/26; H05B 2214/02; B64C 27/32; B64C 2201/024; B64C 11/00; H05K 3/0026; H05K 3/18
See application file for complete search history.

(56) References Cited

U.S. PATENT DOCUMENTS 5,572,178 A 11/1996 Becker et al.
9,462,699 B2 10/2016 Radi et al.
(Continued)

FOREIGN PATENT DOCUMENTS

CN 101859613 A 10/2010
EP 2762407 A1 8/2014
(Continued)

OTHER PUBLICATIONS

French Search Report for FR 1770681, Completed by the French Patent Office, dated Feb. 22, 2018, All together 7 Pages.

*Primary Examiner* — Brian M O'Hara
*Assistant Examiner* — Keith L Dixon
(74) *Attorney, Agent, or Firm* — Brooks Kushman P.C.

(57) ABSTRACT

A piece of rotary equipment for a drone, the rotary equipment having a rotary assembly including at least one blade. The rotary assembly includes at least one furrow that extends in a skin from a first end to a second end, the at least one furrow being at least arranged over the blade, the at least one furrow presenting at least one change of direction on the blade, the rotary assembly including at least one deicer having an electrically conductive track that extends in the at least one furrow, the electrically conductive track extending from a first terminal to a second terminal, the first terminal being present at the first end and the second terminal being present at the second end, the deicer including a protective layer covering the electrically conductive track.

11 Claims, 2 Drawing Sheets

(51) Int. Cl.
  *B64C 27/32*      (2006.01)
  *B64C 39/02*      (2006.01)
  *H05K 3/00*       (2006.01)
  *H05K 3/18*       (2006.01)

(52) U.S. Cl.
  CPC ............ *H05K 3/0026* (2013.01); *H05K 3/18* (2013.01); *B64C 2201/024* (2013.01); *H05B 2203/013* (2013.01); *H05B 2214/02* (2013.01)

(56) References Cited

U.S. PATENT DOCUMENTS

| | | |
|---|---|---|
| 9,596,719 B2 | 3/2017 | Offermann et al. |
| 9,745,070 B2 * | 8/2017 | Brouwers ............ H05B 1/0236 |
| 2008/0191096 A1 * | 8/2008 | Fahrner ................. B64D 15/12 244/134 D |
| 2009/0041996 A1 * | 2/2009 | Boissy ................. B64D 15/12 428/215 |
| 2015/0175805 A1 | 6/2015 | Schaefer |
| 2015/0280312 A1 | 10/2015 | Poggio |
| 2016/0363367 A1 | 12/2016 | Hitzelberger |

FOREIGN PATENT DOCUMENTS

| | | |
|---|---|---|
| EP | 2957661 A1 | 12/2015 |
| EP | 2591638 B1 | 10/2016 |
| FR | 3028242 A1 | 5/2016 |
| GB | 2291575 A | 1/1996 |

\* cited by examiner

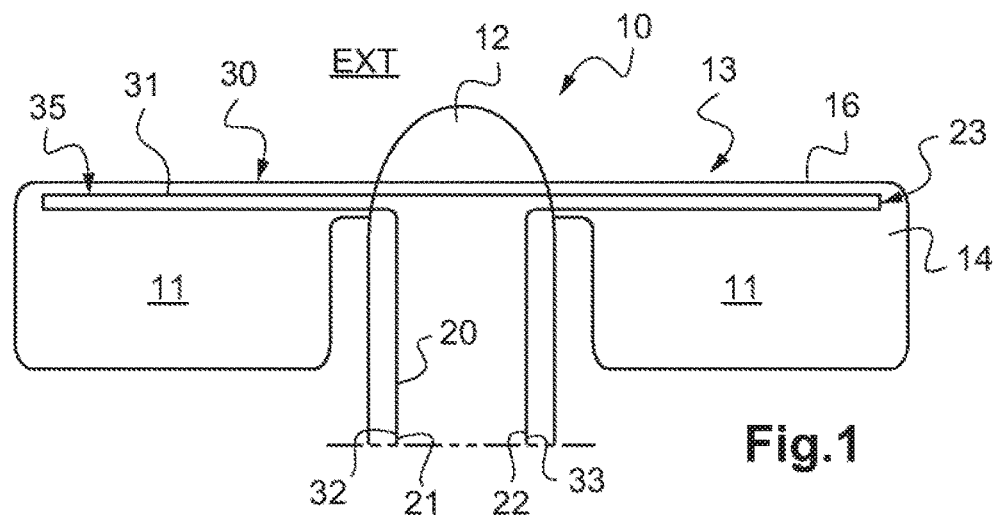
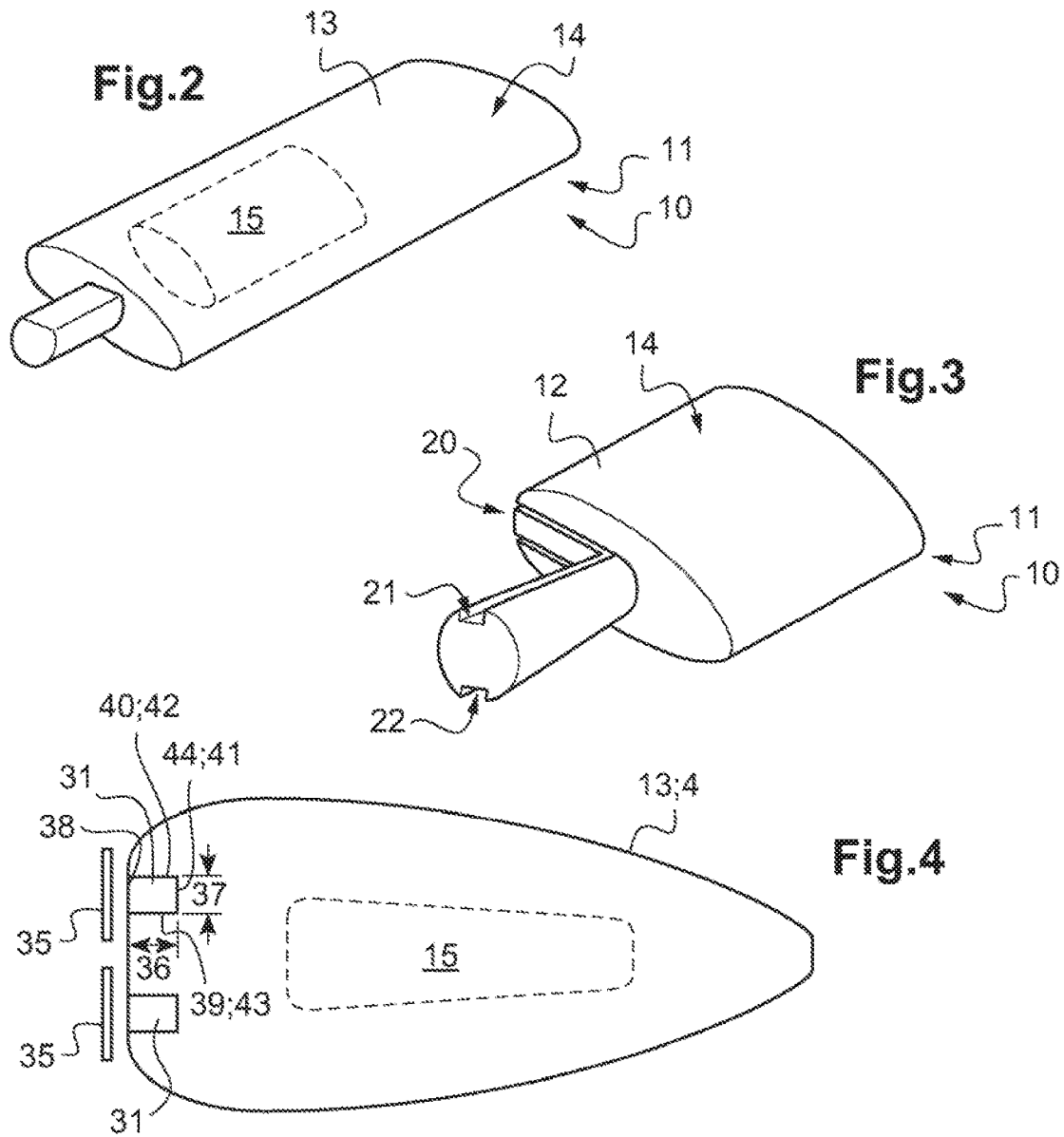

METHOD OF FABRICATING ROTARY EQUIPMENT FOR A ROTARY WING, PROVIDED WITH A DEICER, SAID ROTARY EQUIPMENT, AND A DRONE PROVIDED WITH SAID ROTARY EQUIPMENT

CROSS-REFERENCE TO RELATED APPLICATIONS

This application claims priority to French patent application No. FR 1770681 filed on Jun. 27, 2017, the disclosure of which is incorporated in its entirety by reference herein.

BACKGROUND OF THE INVENTION (1) Field of the Invention

The present invention relates to a method of fabricating rotary equipment for a rotary wing provided with a deicer, to said rotary equipment, and to a drone provided with said rotary equipment.

The invention thus lies in the narrow technical field of drones, and of deicer systems for drones.

2) Description of Related Art

A helicopter is sometimes provided with a deicer system. The deicer system may comprise heater mats arranged in the blades of the main rotor of the helicopter. Each heater mat is arranged between a leading edge cover of a blade and a body of the blade. The heater mats are powered electrically by a source of electrical energy arranged in the helicopter. Under such circumstances, electricity transfer means is arranged in a rotor mast that drives the main rotor in rotation, the electricity transfer means comprising a stationary portion that is electrically connected to the source of electrical energy and a movable portion that is electrically connected to the heater mats.

That technology is proven, but does not appear to be transposable to a drone having rotors, in particular a drone of small size.

Specifically, a drone is of small size. Under such circumstances, the rotors of the drone comprise blades that are also of small size. Consequently, arranging a heater mat in a blade of a drone rotor would appear to be difficult. In addition, the electrical connectors suitable for connecting two electric wires usually present dimensions that are too large, given the dimensions of the blades of a rotor of a drone.

It is therefore difficult to envisage arranging a deicer on a drone blade.

Furthermore, a drone rotor is rotated by a solid rotor mast, which appears to be incompatible with arranging helicopter electricity transfer means.

In another aspect, there exists a method of fabrication known as laser direct structuring (LDS). That method is used to generate an electrically conductive track on a support. The support presents a composite or thermoplastic material including an additive, with the additive being in the form of an organic metal. The additive is "activated" by passing a laser. The laser creates microscopic craters and scores in which copper can be firmly anchored by dipping the part in a catalyst bath.

That method is not associated with deicing a blade, but serves to obtain parts that are not electrically resistive in order to avoid loss of signal. Those parts therefore appear to be ill-suited for being subjected to heating by the Joule effect.

Documents CN 101 859 613, US 2015/175805, and US 2015/280312 deal with the LDS method.

Documents U.S. Pat. No. 9,462,699, EP 2 591 638, GB 2 291 575, EP 2 762 407, and FR 3 028 242 are also known.

Document US 2016/363367 is very far removed from the field of the invention, since it deals with a refrigerator.

BRIEF SUMMARY OF THE INVENTION

An object of the present invention is thus to propose a method making it possible to obtain rotary equipment for a drone, which equipment is provided with a deicer.

The invention provides in particular a method of fabricating a piece of rotary equipment for a drone. The rotary equipment contributes at least in part to providing the drone with propulsion and/or lift. The rotary equipment comprises a rotary assembly provided with a deicer, the rotary assembly having at least one blade. The method comprises fabricating said piece of rotary equipment by a laser direct structuring method by performing the following steps:

fabricating the rotary assembly, the rotary assembly having a skin, the skin comprising a composite material provided with an organic metal;

using a laser to make at least one furrow in an outside face of the skin, the furrow extending from a first end to a second end, the furrow being formed at least over said at least one blade, the furrow presenting at least one change of direction on said at least one blade;

making an electrically conductive track of the deicer in said at least one furrow by dipping the rotary assembly in a bath containing a metal, e.g. copper, said electrically conductive track extending from a first terminal to a second terminal, the first terminal being present at the first end and the second terminal being present at the second end; and covering the electrically conductive track with a protective layer.

The term "change of direction" means that the electrically conductive track is not a straight line. The electrically conductive track may thus present a segment entering a blade and a segment leaving the blade in an electricity flow direction along the electrically conductive track.

Under such circumstances, the method enables a rotary assembly to be fabricated by conventional methods, e.g. by 3D printing, by molding, by injection molding.

The rotary assembly also presents a skin including an organic metal so as to be capable of being structured by a laser direct structuring method. Known materials compatible with that method can be envisaged. For example, the structure may comprise a copper-filled composite material.

During such laser direct structuring, a laser digs a groove in the rotary assembly to follow a predefined pattern. This groove is referred to for convenience as a "furrow". Since the laser can be arranged on a robotic arm, it can draw furrows of complex shape, e.g. spiral-shapes, zigzag. Each furrow also receives an electrically conductive track, e.g. made of copper, that is made during a metal-plating step.

Optionally, each blade has at least one electrically conductive track extending sinuously over at least the leading edge of the blade.

A portion of the electrically conductive track constitutes an electrically resistive deicer member of a deicer, while other segments represent electrical connection lines.

Unlike conventional laser direct structuring methods that seek to make electrical tracks of low resistance, the invention proposes making an electrical track that presents considerable resistance in order to provide Joule-effect heating at the voltage applied to the terminal.

Specifically, the Applicant has observed that it is possible to obtain an electrically conductive track of small dimensions that conveys electricity, the electricity presenting a particular voltage at the terminals of the electrically conductive track in order to heat the blade for deicing purposes.

Under such circumstances, the method makes it possible to obtain a blade of small dimensions that is provided with a deicer.

Furthermore, the electrically conductive track can operate with relatively little electrical energy, thereby optimizing the electrical energy sources of the drone.

In addition, the electrically conductive track can serve to increase the mechanical strength of the blade.

Furthermore, one or more or each of the electrically conductive tracks is covered by a protective layer, e.g. of the pyranol resin type. This protective layer tends to slow down the erosion of an electrically conductive track.

The method of the invention may also include one or more of the following characteristics.

Thus, the rotary assembly may be made solely out of the material constituting the skin.

In another option, the fabrication of the rotary assembly may include a step of making a central core and a step of covering said central core with said skin.

For example, a blade body made of wood may be covered in the skin of the invention.

In an aspect, said electrically conductive track extends over a length from the first terminal to the second terminal, said electrically conductive track extending in a thickness direction from a bottom face in contact with a bottom of said at least one furrow to a top face, said electrically conductive track extending in a width direction between two sides respectively in contact with two flanks of said at least one furrow, and each of said thickness and said width may lie in the range 30 micrometers (μm) included to 60 μm included.

This size makes it possible to obtain a resistive electrically conductive track that provides Joule-effect heating when the electrical track conveys electricity, and in particular an electric current corresponding to a voltage of the order of 10 volts (V) to 14 V across the terminals of the electrically conductive track.

In an aspect, the rotary assembly may comprise at least two blades and a hub, said at least two blades being carried by said hub, and said at least two blades and said hub may form a single piece.

The blades and the hub form a single piece that may be made in one operation.

In an aspect, the electrically conductive track may extend over said hub and over at least one blade, said first end and said second end together with the first terminal and the second terminal being present on said hub.

For example, a single electrically conductive track may extend sinuously over all of the blades and the hub.

In addition to a method, the invention also provides a piece of rotary equipment for a drone, the rotary equipment having a rotary assembly that includes at least one blade.

The rotary assembly includes a skin with at least one furrow extending over an outside face of said skin from a first end to a second end, said at least one furrow being formed at least in said blade, said at least one furrow presenting at least one change of direction in said blade, said rotary assembly including at least one deicer, said deicer comprising an electrically conductive track extending in said at least one furrow, said electrically conductive track extending from a first terminal to a second terminal, the first terminal being present at the first end and the second terminal being present at the second end, said deicer having a protective layer covering said electrically conductive track.

The rotary equipment may further comprise one or more of the following characteristics.

Thus, the rotary assembly may include a central core arranged inside said skin.

In an aspect, said electrically conductive track extends over a length from the first terminal to the second terminal, said electrically conductive track extending in a thickness direction from a bottom face in contact with a bottom of said at least one furrow to a top face, said electrically conductive track extending in a width direction between two sides respectively in contact with two flanks of said at least one furrow, said thickness and said width each lying in the range 30 μm to 60 μm.

In an aspect, said rotary assembly may comprise at least two blades and a hub, said at least two blades being carried by said hub, and said at least two blades and said hub may form a single piece.

Unlike a helicopter, all of the blades and the hub may form a single piece, and thus a single block.

In an aspect, an electrically conductive track may extend over said hub and over at least one blade, said first end and said second end together with said first terminal and said second terminal being present on said hub.

In an aspect, said protective layer may comprise a polyurethane varnish.

Such a protective layer can easily be applied with a varnish spray can.

In addition to a piece of rotary equipment for a drone, the invention also provides a drone having a body, the body carrying at least one rotor. Under such circumstances, said at least one rotor includes a piece of rotary equipment of the invention.

For example, all of the rotors comprise a piece of rotary equipment of the invention.

In aspect, said drone includes an electric motor having a frame and a rotor mast, said rotor mast being mechanically connected to said rotary assembly, and said drone may include electricity transfer means, said electricity transfer means having a stationary portion electrically connected to a movable portion, said stationary portion being electrically connected to an electrical energy source, said movable portion being electrically connected to said first terminal and to said second terminal, said movable portion being secured to said rotor mast and being arranged around the rotor mast.

The drone thus possesses one or more energy sources. Furthermore, each energy source may comprise one or more optionally rechargeable batteries.

Under such circumstances, a rotor provided with a piece of rotary equipment of the invention co-operates with electricity transfer means arranged around a rotor mast. Each electricity transfer means serves to allow electricity to flow from an electrical energy source placed in a stationary reference frame to each blade of a rotor present in a rotary reference frame.

Where applicable, a single energy source may be connected to all of the electricity transfer means of the drone.

The term "electricity transfer means" is used herein to designate equipment that enables electricity to be transferred between a stationary reference frame and a rotary reference frame while it is rotating, possibly while also transforming the electricity.

By way of example, it is possible to use "slip ring" type transfer means. Such transfer means comprise at least one slip ring and at least one brush in contact with the slip ring. In one variant, the slip ring is carried by the movable portion and each brush is carried by the stationary portion. In another variant, the slip ring is carried by the stationary portion and each brush is carried by the movable portion.

In another example, the electricity transfer means may comprise a rotary transformer. By way of example, it is possible to use a transformer of the type described in Document U.S. Pat. No. 5,572,178.

Furthermore, the drone may include a switch or the equivalent so that each electrically conductive track of the drone is either electrically powered or not. The switch may be remotely controlled by a deicer control via a wireless link. Optionally, the deicer control may cause either all of the blades to be deiced or may prevent deicing on all of the blades. The deicer control is then of the on/off type.

In an aspect, the movable portion may be secured to a resilient member, said resilient member being secured to the rotor mast.

The resilient member may comprise a band adhesively bonded on the rotor mast. For example, the band may comprise an elastomer.

The resilient member may tend to allow the electricity transfer means to operate in the presence of a small axial offset of the rotor mast.

In an aspect, said stationary portion may be secured to said frame.

For example, the electric motor may comprise a frame and a rotor mast projecting from the frame. The rotor mast then passes through the electricity transfer means in order to be secured to the rotary assembly.

The stationary portion of the electricity transfer means is then locked on the frame of the motor. The stationary portion thus does not move in rotation in the reference frame of the drone, unlike the movable portion which rotates together with the rotor mast relative to the frame.

In an aspect, at least two wires may extend from said movable portion respectively to said first terminal and to said second terminal, one of said at least two wires being placed against said first terminal and one of said at least two wires being located against said second terminal, a heat-shrink sleeve surrounding said at least two wires and said first terminal and said second terminal.

Each wire may be soldered and/or adhesively bonded to a terminal under the heat-shrink sleeve. The sleeve provides the electrical connection with mechanical and environmental protection.

In an aspect, the energy source may deliver electricity at a voltage lying in the range 12 V to 14 V.

Several voltage levels are possible. In preferred manner, the energy source delivers electricity at a voltage level lying in the range 12 V to 14 V in order to optimize deicing.

BRIEF DESCRIPTION OF THE DRAWINGS

The invention and its advantages appear in greater detail from the context of the following description of examples given by way of illustration and with reference to the accompanying figures, in which:

FIG. 1 is a diagram of a piece of rotary equipment of the invention;

FIGS. 2 to 4 are diagrams showing the steps of the method of the invention;

DETAILED DESCRIPTION OF THE INVENTION

Figure 5:
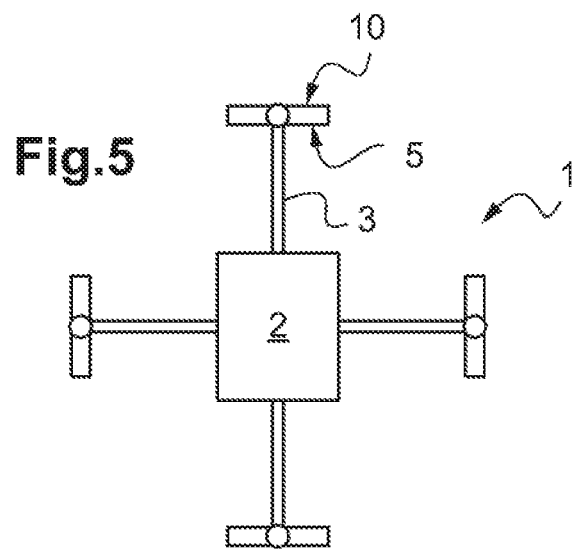
FIG. 5 is a diagram of a drone of the invention.

Elements present in more than one of the figures are given the same reference in each of them.

FIG. 1 shows a piece of rotary equipment for a drone of the invention.

This piece of rotary equipment comprises an aerodynamic rotary assembly 10 that is provided with at least one blade 11. By way of example, the rotary assembly 10 has a plurality of blades 11 that are optionally rigidly secured to a hub 12. The hub 12 may then be fastened to a rotor mast of a drone.

Where appropriate, the hub 12 and the blades 11 may form a single piece, unlike rotors provided with blades that are pinned to a hub, for example.

Furthermore, the rotary assembly 10 presents a skin 13. Depending on the variant, the rotary assembly 10 may comprise one or more central cores covered by the skin 13, or it may comprise a single optionally-solid structure 13 that defines the skin 13.

Independently of the presence or the absence of a central core within the skin 13, the rotary assembly 10 includes at least one deicer 30.

Thus, the rotary assembly 10 has at least one furrow 20 formed in the skin 13, and in particular in an outside face 14 of the skin 13 facing an outside medium EXT situated outside the rotary assembly 10. The furrow 20 is substantially defined by a bottom and by flanks forming a U-shape so that the furrow is open towards the outside medium EXT.

The furrow 20 extends from a first end 21 to a second end 22. The furrow 20 follows a sinuous path over the outside face 14 of the skin 13 going from its first end to its second end, and running along at least one blade 11. Furthermore, the furrow 20 presents at least one change of direction 23 on the blade 11 in order to enter and leave an aerodynamic segment of the blade. For example, at least one furrow 20 runs along and/or in the immediate proximity of the leading edge 16 of the blade 11.

By way of example, a single furrow runs along a plurality of blades 11, or indeed over all of the blades 11 and also over the hub.

Furthermore, each piece of rotary equipment includes at least one deicer 30.

Under such circumstances, each deicer 30 of a piece of rotary equipment 10 has an electrically conductive track 31 arranged in a furrow 20. The deicer is thus integrated in the rotary assembly, with the deicer and the rotary assembly forming an inseparable whole. The electrically conductive track 31 thus extends lengthwise from a first electrical terminal 32 to a second electrical terminal 33. The first terminal 32 is arranged at the first end 21 of a furrow 20, with the second terminal 33 being arranged at the second end 22 of the furrow.

Where appropriate, a single electrically conductive track 31 extends over the hub 12 and over at least one blade 11, or indeed at least two blades 11. The first end 21 and the second end 22 of a furrow, together with said first terminal 32 and said second terminal 33 of the electrically conductive track arranged in the furrow are present on the hub 12.

An electrically conductive track 31 may present thickness and width that are small relative to the voltage present between the first terminal 32 and the second terminal 33 of the electrically conductive track 31. For example, the thickness and the width may lie in the range 30 µm to 60 µm, with said voltage lying in the range 12 V to 14 V.

Furthermore, the deicer 30 may include at least one protective layer 35 that covers at least one electrically conductive track 31.

FIGS. 2 to 4 show a method of the invention for fabricating such a rotary assembly 10 provided with an integrated deicer 30.

With reference to FIG. 2, the method includes a step of fabricating the rotary assembly 10.

FIG. 2 shows a rotary assembly 10 comprising for convenience only one blade 11 in order to illustrate the invention. Nevertheless, the rotary assembly 10 may further comprise a hub, and possibly a plurality of blades together forming a single piece.

During this fabrication step, a rotary assembly 10 that has a skin 13 is fabricated. In particular, the skin 13 is made out of at least one material that is provided with an organic metal, e.g. a copper-filled composite material.

Optionally, the rotary assembly 10 may be made by performing a molding method, an injection molding method, a 3D printing method, . . . .

Optionally, the fabrication step may include a substep of fabricating one or more central cores 15, followed by a substep of covering each central core 15 with said skin 13.

At the end of the fabrication step, the rotary assembly 10 is thus obtained. This rotary assembly 10 comprises at least a skin 13 having an outside face 14.

Under such circumstances, and with reference to FIG. 3, the method includes a step of using a laser to make at least one furrow 20 in the outside face 14 by the laser direct structuring method. At least one furrow extending from a first end 21 to a second end 22 is dug by a laser in the skin 13, the furrow 20 presenting at least one change of direction on a blade 11.

Subsequently, and with reference to FIG. 4, the method includes a step of making an electrically conductive track 31 of a deicer 30.

The electrically conductive track 31 is formed in each furrow 20 by dipping the rotary assembly 10 in a bath containing a metal, e.g. using a method of metal-plating by electrolysis. Each electrically conductive track 31 thus extends from a first terminal 32 to a second terminal 33.

Optionally, at least one electrically conductive track 31 extends over the hub 12 and over at least one blade 11, the first end 21 and the second end 22 together with the first terminal 32 and the second terminal 33 being present on said hub 12.

Thereafter, the method includes a step of covering one or each electrically conductive track 31 with a protective layer 35. For example, a polyurethane varnish is sprayed onto each electrically conductive track 31.

The laser may be designed so as to obtain electrically conductive tracks 31 that present particular dimensions.

By construction, each electrically conductive track 31 extends over a length between the first terminal 32 and the second terminal 33 of the electrically conductive track 31. Furthermore, the electrically conductive track extends in its thickness direction 36 from a bottom face 44 in contact with a bottom 41 of said at least one furrow 20 to a top face 38 covered in the protective layer 35. In addition, the electrically conductive track 31 extends in its width direction 37 between two sides 39 and 40 that are respectively in contact with two flanks 42 and 43 of the furrow receiving the track. The laser may then be designed so that the thickness 36 and the width 37 each lie in the range 30 µm to 60 µm.

With reference to FIG. 5, a piece of rotary equipment of the invention may be arranged on a drone 1. The drone 1 may have a body 2 carrying at least one rotor 5, e.g. via an arm 3. The rotor thus includes a piece of rotary equipment of the invention. Optionally, each rotor 5 includes a respective piece of rotary equipment of the invention.

Figure 6:
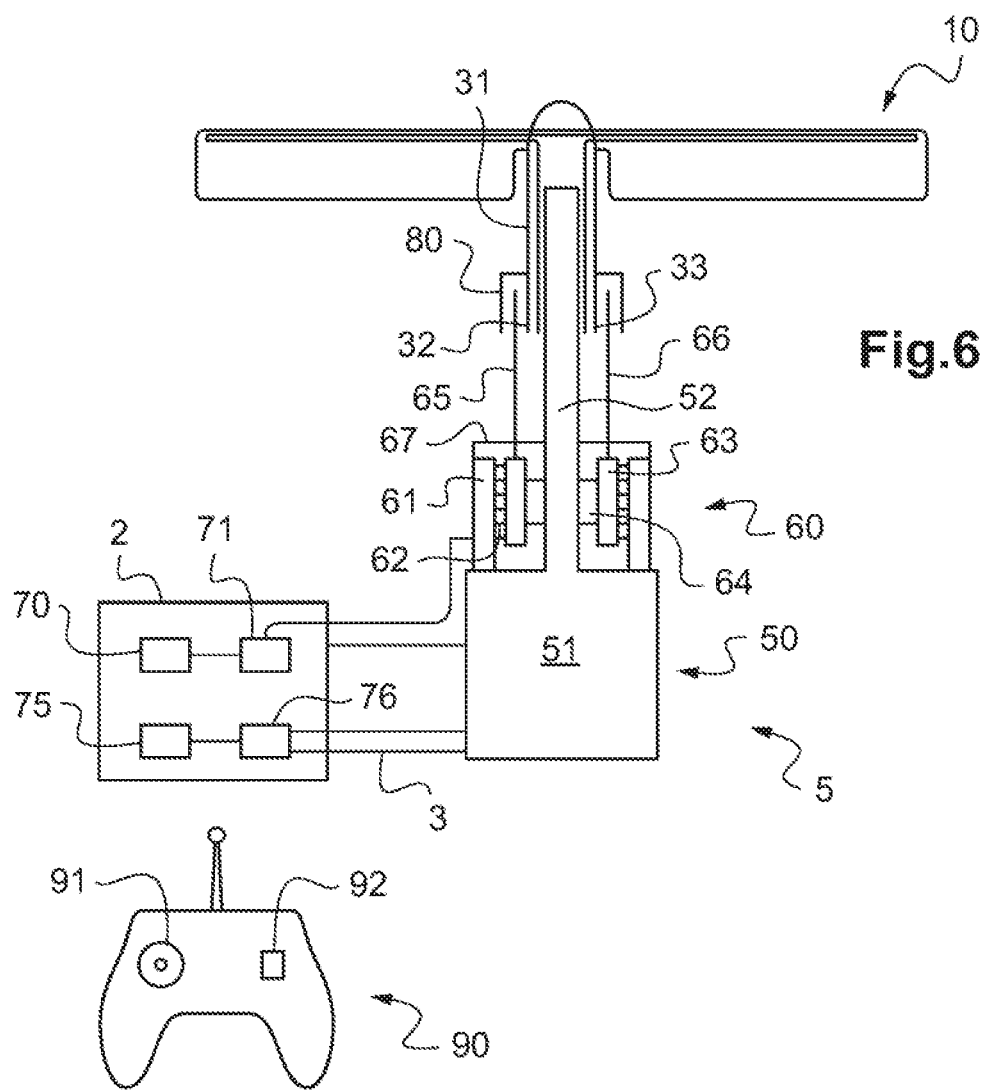
FIG. 6 is a diagram showing a piece of rotary equipment of said drone.

FIG. 6 shows such a rotor 5 having a piece of rotary equipment of the invention. This configuration is optionally reproduced by all of the rotors 5.

In order to rotate the rotary assembly 10 of a piece of rotary equipment of a rotor 5, the drone 1 has an electric motor 50. The electric motor 50 is connected to an electrical energy storage member 75, possibly via a switch 76 or the equivalent. The electric motor 50, or the switch 76, if any, may be remotely controlled by piloting control means 91 forming part of a remote control 90.

The electric motor 50 has a frame 51 carried by an arm 3. The electric motor 50 thus possesses an outlet shaft that projects from the frame 51. The outlet shaft constitutes a rotor mast 52 that is constrained to rotate with the rotary assembly 10. The rotor mast 52 is optionally solid. By way of example, the rotary assembly then comprises a hub 12 fastened to a free end zone of the rotor mast by conventional means, such as for example screw fastening, adhesive, riveting, welding, stapling, . . . means.

Furthermore, the drone 1 has a source of electrical energy 70 for causing electricity to flow in each electrically conductive track 31 of the rotary assembly 10. This electrical energy source 70 may comprise one or more optionally rechargeable batteries . . . . The electrical energy source 70 may for example be located in the body 2. The electrical energy source 70 may deliver electricity at a voltage lying in the range 12 V to 14 V, for example. Furthermore, the electrical energy source 70 and the above-mentioned electrical energy storage member 75 may constitute single electrical energy storage means or two different electrical energy storage means.

The drone is then provided for each rotor with respective electricity transfer means that are electrically interposed between the electrical energy source and the rotary assembly of the rotor in order to transfer electricity from the stationary reference frame of the body 2 to a rotary reference frame of the rotor 5 and the rotary assembly 10, while they are rotating.

Under such circumstances, the electricity transfer means 60 comprise a stationary portion 61 that is electrically connected to a movable portion 63 of the electricity transfer means 60.

The stationary portion 61 is optionally secured to the frame 51 of the electric motor, via a protective casing 67 of the electricity transfer means, if any.

The movable portion 63 is secured to the rotor mast 52, having the rotor mast 52 passing therethrough. By way of example, the movable portion 63 comprises a tube surrounding the rotor mast 52.

Optionally, the movable portion 63 is fastened to a resilient member 64 by conventional means such as screw fastening, adhesive, riveting, welding, staple means. The resilient member 64 is also secured to the rotor mast 52. For example, the resilient member comprises a band with a bead of adhesive fastening the band to the rotor mast 52.

Furthermore, the stationary portion 61 is electrically in communication with the movable portion 63. For example, the electricity transfer means has brushes 62 in contact with slip rings. In one variant, the stationary portion carries the brushes, with the movable portion carrying the slip rings in contact with the brushes. In another variant, the movable portion carries the brushes and the stationary portion carries the slip rings in contact with the brushes. The stationary portion may surround the movable portion. The movable portion may surround the rotor mast locally.

Nevertheless, any type of electricity transfer means could be envisaged.

Furthermore, the stationary portion 61 is electrically connected to the electrical energy source 70 by an electrical connection. This electrical connection may comprise one or more electric wires together with a switch 71 for the equivalent.

Where appropriate, the switch 71 of the electricity transfer means may be remotely controlled using a deicer control 92 carried by a remote control 90. In the presence of a plurality of rotary assemblies that are electrically powered via respective electricity transfer means connected to switches, the deicer control may serve to control all of the switches. Alternatively, an electrical energy source may be connected to a single switch 71, the switch 71 being connected to all of the electricity transfer means of the drone.

Furthermore, the movable portion 63 is electrically connected to the first terminal 32 and to the second terminal 33 of each electrically conductive track of a rotary assembly.

Under such circumstances, at least two wires 65, 66 extend from the movable portion 63 respectively to the first terminal 32 and to the second terminal 33 of an electrically conductive track.

A first wire 65 is thus placed against the first terminal 32 and a second wire 66 is located against the second terminal 33. A heat-shrink sleeve 80 may be arranged around the connection by surrounding the first wire 65 and the second wire 66 together with the first terminal 32 and the second terminal 33.

Such a fastener system may optionally serve to enable the rotary assembly to be disassembled easily.

Naturally, the present invention may be subjected to numerous variations as to its implementation. Although several embodiments are described, it will readily be understood that it is not conceivable to identify exhaustively all possible embodiments. It is naturally possible to envisage replacing any of the means described by equivalent means without going beyond the ambit of the present invention.

What is claimed is:

1. A method of fabricating a piece of rotary equipment for a drone, the rotary equipment comprising a rotary assembly provided with a deicer, the rotary assembly comprising at least one blade, wherein the method comprises fabricating the rotary equipment by a laser direct structuring method by performing the following steps:
    fabricating the rotary assembly, the rotary assembly having a skin, the skin comprising a composite material provided with an organic metal;
    using a laser to make at least one furrow in an outside face of the skin, the at least one furrow extending from a first end to a second end, the at least one furrow being formed at least over the blade, the at least one furrow presenting at least one change of direction on the blade;
    making an electrically conductive track of the deicer in the at least one furrow by dipping the rotary assembly in a bath containing a metal, the electrically conductive track extending from a first terminal to a second terminal, the first terminal being present at the first end and the second terminal being present at the second end; and
    covering the electrically conductive track with a protective layer.

2. The method according to claim 1, wherein the fabrication of the rotary assembly includes a step of making a central core and a step of covering the central core with the skin.

3. The method according to claim 1, wherein the electrically conductive track extends over a length from the first terminal to the second terminal, the electrically conductive track extending in a thickness direction from a bottom face in contact with a bottom of the at least one furrow to a top face, the electrically conductive track extending in a width direction between two sides respectively in contact with two flanks of the at least one furrow, the thickness and the width each lying in the range 30 µm to 60 µm.

4. The method according to claim 1, wherein the rotary assembly comprises at least two blades and a hub, the at least two blades being carried by the hub, and the at least two blades and the hub forming a single piece.

5. The method according to claim 4, wherein the electrically conductive track extends over the hub and over at least one blade, the first end and the second end together with the first terminal and the second terminal being present on the hub.

6. A piece of rotary equipment provided with a rotary assembly for a drone, the rotary assembly being provided with at least one blade and including a skin with at least one furrow extending in an outside face of the skin from a first end to a second end, the at least one furrow being formed at least in the blade, the at least one furrow presenting at least one change of direction in the blade, the rotary equipment including at least one deicer, the deicer comprising an electrically conductive track extending in the at least one furrow, the electrically conductive track extending from a first terminal to a second terminal, the first terminal being present at the first end and the second terminal being present at the second end, the deicer having a protective layer covering the electrically conductive track.

7. The piece of rotary equipment according to claim 6, wherein the rotary equipment includes a central core arranged inside the skin.

8. The piece of rotary equipment according to claim 6, wherein the electrically conductive track extends over a length from the first terminal to the second terminal, the electrically conductive track extending in a thickness direction from a bottom face in contact with a bottom of the at least one furrow to a top face, the electrically conductive track extending in a width direction between two sides respectively in contact with two flanks of the at least one furrow, the thickness and the width each lying in the range 30 µm to 60 µm.

9. The piece of rotary equipment according to claim 6, wherein the rotary assembly comprises at least two blades and a hub, the at least two blades being carried by the hub, and the at least two blades and the hub forming a single piece.

10. The piece of rotary equipment according to claim 9, wherein the electrically conductive track extends over the hub and over at least two blades, the first end and the second end together with the first terminal and the second terminal being present on the hub.

11. The piece of rotary equipment according to claim 6, wherein the protective layer comprises a polyurethane varnish.

\* \* \* \* \*